(12) United States Patent
Nagata

(10) Patent No.: US 6,785,106 B2
(45) Date of Patent: Aug. 31, 2004

(54) INTEGRATE CIRCUIT DEVICE

(75) Inventor: Junichi Nagata, Okazaki (JP)

(73) Assignee: Denso Corporation, Kariya (JP)

( * ) Notice: Subject to any disclaimer, the term of this patent is extended or adjusted under 35 U.S.C. 154(b) by 204 days.

(21) Appl. No.: 10/050,745

(22) Filed: Jan. 16, 2002

(65) Prior Publication Data

US 2002/0093360 A1 Jul. 18, 2002

(30) Foreign Application Priority Data

Jan. 16, 2001 (JP) .................................... 2001-007673

(51) Int. Cl.[7] .............................................. H02H 3/18
(52) U.S. Cl. ...................................................... 361/86
(58) Field of Search ............................ 361/18, 58, 78, 361/86, 88, 91.1, 92; 363/50

(56) References Cited

U.S. PATENT DOCUMENTS 4,358,812 A * 11/1982 LoCascio et al. ............ 361/152
5,926,384 A *  7/1999 Jochum et al. ............. 363/56.05
6,392,463 B1 *  5/2002 Kitagawa et al. ............ 327/309

FOREIGN PATENT DOCUMENTS

| JP | 56-22975 | 3/1981 |
|----|----------|--------|
| JP | 3-54841 | 3/1991 |
| JP | 2550703 | 8/1996 |
| JP | 9-242589 | 9/1997 |
| JP | 9-274515 | 10/1997 |
| JP | 10-174310 | 6/1998 |
| JP | 10-257799 | 9/1998 |
| JP | 2833100 | 10/1998 |
| JP | 10-335998 | 12/1998 |
| JP | 2001-007673 | 1/2001 |

* cited by examiner

*Primary Examiner*—Matthew V. Nguyen
(74) *Attorney, Agent, or Firm*—Harness, Dickey & Pierce, PLC

(57) ABSTRACT

An integrated circuit device includes an output terminal for connection with a terminal of an external load, and first and second power supply terminals for connection with a terminal of an external power supply. A switching element is connected between the output terminal and the first power supply terminal. The switching element, the external load, and the external power supply form a load current flow path. An impedance circuit is connected between the output terminal and the second power supply terminal. An abnormality detection circuit operates for monitoring a voltage at the output terminal, and detecting an abnormal condition on the basis of the monitored voltage. A drive control circuit operates for driving and controlling the switching element.

21 Claims, 9 Drawing Sheets

INTEGRATE CIRCUIT DEVICE

BACKGROUND OF THE INVENTION

1. Field of the Invention

This invention relates to an integrated circuit device provided with a circuit for detecting an abnormal condition such as a short circuit or the breaking of a wire.

2. Description of the Related Art

Japanese patent application publication number 9-274515 discloses an actuator fault discriminator which is able to detect not only a disconnection fault of an actuator but also a to-ground short-circuit fault thereof. The actuator fault discriminator and an actuator controller are contained in a microcomputer-based electronic control unit (ECU). The actuator is connected between a battery and the ECU. Under the control by the ECU, a drive current ID caused by the battery flows through the actuator. The ECU includes a CPU and a power transistor. The CPU outputs a drive signal D to the base of the power transistor, thereby implementing ON/OFF control of the power transistor. The emitter of the power transistor is grounded. The collector of the power transistor is connected via a current sensor to the actuator. After passing through the actuator, the drive current ID flows through the current sensor and the collector-emitter path of the power transistor. The current sensor detects the drive current ID, thereby generating a signal representing the detected value Id of the drive current ID. The ECU includes a reference generator for producing a signal representative of a reference current value IR corresponding to a normal condition of the actuator. The ECU includes a comparator for comparing the signal of the detected current value Id and the signal of the reference current value IR, and for detecting a fault of the actuator in response to a result of the comparison. An output signal from the comparator which represents the comparison result is fed to the CPU.

Japanese patent application publication number 10-257799 discloses a multiple-channel output device provided with an output open-circuiting detector. In the output device of Japanese application 10-257799, the coils of stepping motors are connected between a drive circuit and a ground. The drive circuit has output terminals leading to the coils of the stepping motors respectively. The drive circuit has output transistors. The collectors of the output transistors lead to the output terminals, respectively. The emitters of the output transistors are connected to a drive voltage source. A high-resistance resistor is connected between the emitter and the collector of each of the output transistors. The output terminals of the drive circuit are respectively connected to the input terminals of an OR circuit. The OR circuit is connected to a timer capacitor followed by a comparator. When one of the coils of the stepping motors breaks, a high-level voltage is transmitted from the drive voltage source to the OR circuit via the related high-resistance resistor and the related output terminal of the drive circuit so that the OR circuit outputs a high-level signal. The timer capacitor is charged in response to the high-level signal, and hence the voltage across the timer capacitor rises. When the voltage across the timer capacitor exceeds a prescribed level, the comparator outputs a high-level signal indicating that one of the coils of the stepping motors breaks.

Japanese patent application publication number 56-22975 discloses a method of evaluating an integrated circuit device. In Japanese application 56-22975, an integrated circuit has a power supply terminal, a ground terminal, input terminals, and output terminals. A voltage lower than the p-n junction forward voltage is applied between the power supply terminal and the ground terminal while all the input and output terminals remain open. In the case where an integrated-circuit element connected between the power supply terminal and the ground terminal is ideal, no current flows between the power supply terminal and the ground terminal since the voltage applied therebetween is lower than the p-n junction forward voltage. In the event that the integrated-circuit element is out of an ideal condition, a leak current flows between the power supply terminal and the ground terminal. The integrated-circuit element is evaluated on the basis of the leak current.

Japanese patent application publication number 3-54841 discloses a BiCMOS semiconductor device which includes an internal gate circuit, and output buffers connected to the internal gate circuit. The internal gate circuit and the output buffers are formed on a common semiconductor chip. A control terminal, which is used only at the time of test, is provided on the semiconductor chip, and is connected to the output buffers through a wiring layer. The control terminal can be subjected to a control signal designed to turn off bipolar transistors at rear ends of the output buffers. In the case where the control signal is fed to the control terminal while a rating power supply voltage is applied to the semiconductor device, the bipolar transistors at the rear ends of the output buffers are turned off so that a steady-state current does not flow through the bipolar transistors. Accordingly, on the basis of a power supply current measured in this condition, the presence or absence of a failure in the output buffers or a MOS transistor of the internal gate circuit can be detected.

Japanese patent number 2833100 relates to a power semiconductor device including first and second power MOS transistors formed on a common chip. The first and second power MOS transistors are connected in a current mirror. Specifically, the drains of the first and second MOS transistors are connected to a common power source via a power supply terminal of the chip. The gates of the first and second MOS transistors are connected to a common drive circuit. The source of the first power MOS transistor is connected to one end of a load via an output terminal of the chip. The other end of the load is grounded. The source of the second power MOS transistor is connected to one end of a current detecting resistor through a sense/in terminal of the chip. The other end of the current detecting resistor is grounded via an NPN transistor. A first comparator operates to compare the voltages at the sources of the first and second power MOS transistors. By referring to an output signal from the first comparator, it is possible to determine whether a current flowing through the load is normal or abnormal, that is, whether or not the load is normal or abnormal. A second comparator operates to compare the voltage at the source of the second power MOS transistor with a prescribed reference voltage. The drive circuit responds to an output signal from the second comparator, driving the first and second MOS transistors in response thereto.

Japanese patent application publication number 9-242589 discloses an electromagnetic actuator driving circuit designed to prevent the exposure of a high voltage in the event that an electric connector with an electrically-driven fuel injection valve is moved out of its normal position. The driving circuit of Japanese application 9-242589 includes switching devices Q1–Q5 for controlling electric connection among the fuel injection valve, a high-voltage power supply, and a low-voltage power supply in response to a fuel injection pulse signal. At the moment of the occurrence of the rising edge of the fuel injection pulse signal, the switching devices Q1 and Q3 are turned on so that a high voltage is applied from the high-voltage power supply to the fuel injection valve. In this case, the applied high voltage opens the fuel injection valve. After the fuel injection valve is opened, the switching devices Q2 and Q3 are in their on states so that a low voltage is applied from the low-voltage power supply to the fuel injection valve. In this case, the applied low voltage holds the fuel injection valve opened. At the moment of the occurrence of the falling edge of the fuel injection pulse signal, the switching devices Q4 and Q5 are turned on so that a reverse high voltage is applied from the high-voltage power supply to the fuel injection valve. In this case, the applied reverse high voltage closes the fuel injection valve. There are resistors R1–R3 connected with the fuel injection valve. Even when the switching devices Q1–Q5 are in their off states, a small current flows through the resistors R1–R3 and the fuel injection valve. A comparator monitors the voltage at a junction between the resistors R2 and R3, detecting whether or not the current flow line (path) breaks.

Japanese patent number 2550703 relates to a semiconductor device including a semiconductor element having a gage oxide film formed on a semiconductor substrate. A gate terminal enables a drive voltage to be applied to a gate of the semiconductor element. A protective circuit formed on the substrate and connected with the gate terminal prevents a voltage higher than a prescribed level from being applied to the gate of the semiconductor element. An inspection voltage applying circuit formed on the substrate is provided between the gate of the semiconductor element and the protective circuit. The inspection voltage applying circuit disables the protective circuit, and applies an inspection voltage higher than the drive voltage to the gate of the semiconductor device.

SUMMARY OF THE INVENTION

It is an object of this invention to provide an improved integrated circuit device.

A first aspect of this invention provides an integrated circuit device comprising an output terminal for connection with a terminal of an external load; first and second power supply terminals for connection with a terminal of an external power supply; a switching element connected between the output terminal and the first power supply terminal, wherein the switching element, the external load, and the external power supply form a load current flow path; an impedance circuit connected between the output terminal and the second power supply terminal; an abnormality detection circuit for monitoring a voltage at the output terminal, and detecting an abnormal condition on the basis of the monitored voltage; and a drive control circuit for driving and controlling the switching element.

A second aspect of this invention provides an integrated circuit device comprising first and second output terminals for connection with a terminal of an external load; a power supply terminal for connection with a terminal of an external power supply; a switching element connected between the first output terminal and the power supply terminal, wherein the switching element, the external load, and the external power supply form a load current flow path; an impedance circuit connected between the second output terminal and the power supply terminal; an abnormality detection circuit for monitoring a voltage at the first and second output terminals, and detecting an abnormal condition on the basis of the monitored voltage; and a drive control circuit for driving and controlling the switching element.

A third aspect of this invention provides an integrated circuit device comprising a package having an output terminal for connection with a terminal of an external load, and a power supply terminal for connection with a terminal of an external power supply; and a chip hermetically provided in the package and having an output-purpose pad and first and second power-supply-purpose pads, the output-purpose pad being connected to the output terminal of the package, the first and second power-supply-purpose pads being connected to the power supply terminal of the package; wherein the chip comprises (1) a switching element connected between the output-purpose pad and the first power-supply-purpose pad, wherein the switching element, the external load, and the external power supply form a load current flow path; (2) an impedance circuit connected between the output-purpose pad and the second power-supply-purpose pad; (3) an abnormality detection circuit for monitoring a voltage at the output-purpose pad, and detecting an abnormal condition on the basis of the monitored voltage; and (4) a drive control circuit for driving and controlling the switching element.

A fourth aspect of this invention provides an integrated circuit device comprising a package having an output terminal for connection with a terminal of an external load, and a power supply terminal for connection with a terminal of an external power supply; and a chip hermetically provided in the package and having first and second output-purpose pads and a power-supply-purpose pad, the first and second output-purpose pads being connected to the output terminal of the package, the power-supply-purpose pad being connected to the power supply terminal of the package; wherein the chip comprises (1) a switching element connected between the first output-purpose pad and the power-supply-purpose pad, wherein the switching element, the external load, and the external power supply form a load current flow path; (2) an impedance circuit connected between the second output-purpose pad and the power-supply-purpose pad; (3) an abnormality detection circuit for monitoring a voltage at the first and second output-purpose pads, and detecting an abnormal condition on the basis of the monitored voltage; and (4) a drive control circuit for driving and controlling the switching element.

A fifth aspect of this invention provides an integrated circuit device comprising an output terminal for connection with a terminal of an external load; a power supply terminal for connection with a terminal of an external power supply; a switching element connected between the output terminal and the power supply terminal, wherein the switching element, the external load, and the external power supply form a load current flow path; an impedance circuit and a switch circuit connected in series between the output terminal and the power supply terminal; an abnormality detection circuit for monitoring a voltage at the output terminal, and detecting an abnormal condition on the basis of the monitored voltage; a drive control circuit for driving and controlling the switching element; and a switch control circuit for setting the switch circuit in a closed state under a condition that the drive control circuit is fed with an operation-purpose power supply voltage.

A sixth aspect of this invention is based on the fifth aspect thereof, and provides an integrated circuit device wherein the switch control circuit comprises means for setting the switch circuit in the closed state when the operation-purpose power supply voltage is equal to or higher than a reference voltage.

A seventh aspect of this invention is based on the sixth aspect thereof, and provides an integrated circuit device wherein the switch circuit comprises a transistor, and the switch control circuit comprises (1) a voltage divider for dividing the operation-purpose power supply voltage to get a division-resultant voltage, (2) a comparison circuit for comparing the division-resultant voltage and the reference voltage with each other, and (3) a drive circuit for driving the transistor in response to a comparison-result signal outputted from the comparison circuit.

An eighth aspect of this invention is based on the fifth aspect thereof, and provides an integrated circuit device wherein the switch circuit comprises a transistor, and the switch control circuit comprises (1) means for dividing the operation-purpose power supply voltage to get a division-resultant voltage, and means for applying the division-resultant voltage to a control terminal of the transistor.

A ninth aspect of this invention is based on the first aspect thereof, and provides an integrated circuit device wherein the impedance circuit comprises a resistor.

A tenth aspect of this invention provides an integrated circuit device comprising an output terminal for connection with a terminal of an external load; a power supply terminal for connection with a terminal of an external power supply; a switching element connected between the output terminal and the power supply terminal, wherein the switching element, the external load, and the external power supply form a load current flow path; an abnormality detection circuit for monitoring a voltage at the output terminal, and detecting an abnormal condition on the basis of the monitored voltage; a drive control circuit for driving and controlling the switching element; and a constant-current circuit connected between the output terminal and the power supply terminal for generating a constant current under a condition that the drive control circuit is fed with an operation-purpose power supply voltage.

An eleventh aspect of this invention is based on the tenth aspect thereof, and provides an integrated circuit device wherein the constant-current circuit comprises a current mirror circuit; and a constant-current generation circuit connected to an input end of the current mirror circuit for outputting a constant current when being fed with the operation-purpose power supply voltage.

A twelfth aspect of this invention is based on the tenth aspect of this invention, and provides an integrated circuit device wherein the constant-current circuit comprises a current mirror circuit; a constant-current generation circuit for feeding a constant current to an input end of the current mirror circuit; and a current control circuit for applying a current output suspension signal to a common control terminal of the current mirror circuit when the operation-purpose power supply voltage is equal to or lower than a reference voltage.

A thirteenth aspect of this invention is based on the tenth aspect thereof, and provides an integrated circuit device further comprising a protective resistor connected between the output terminal and the constant-current circuit.

A fourteenth aspect of this invention provides an integrated circuit device comprising a circuit board having a wiring pattern; an integrated circuit having an output terminal for connection with a terminal of an external load, and first and second power supply terminals for connection with a terminal of an external power supply, the first and second power supply terminals being separated and disconnected from each other when the integrated circuit is separated from the circuit board, the first and second power supply terminals being connected to each other by the wiring pattern of the circuit board when the integrated circuit is mounted on the circuit board; a switching transistor contained in the integrated circuit and being connected between the output terminal and the first power supply terminal, wherein the switching transistor, the external load, and the external power supply form a load current flow path; and a pull-down resistor contained in the integrated circuit and being connected between the output terminal and the second power supply terminal.

A fifteenth aspect of this invention is based on the fourteenth aspect thereof, and provides an integrated circuit device wherein the integrated circuit comprises an abnormality detection circuit for monitoring a voltage at the output terminal, and detecting an abnormal condition in response to the monitored voltage.

A sixteenth aspect of this invention provides an integrated circuit device comprising a circuit board having a wiring pattern; an integrated circuit having first and second output terminals for connection with a terminal of an external load, and a power supply terminal for connection with a terminal of an external power supply, the first and second output terminals being separated and disconnected from each other when the integrated circuit is separated from the circuit board, the first and second output terminals being connected to each other by the wiring pattern of the circuit board when the integrated circuit is mounted on the circuit board; a switching transistor contained in the integrated circuit and being connected between the first output terminal and the power supply terminal, wherein the switching transistor, the external load, and the external power supply form a load current flow path; and a pull-down resistor contained in the integrated circuit and being connected between the second output terminal and the power supply terminal.

A seventeenth aspect of this invention is based on the sixteenth aspect thereof, and provides an integrated circuit device wherein the integrated circuit comprises an abnormality detection circuit for monitoring a voltage at the first and second output terminals, and detecting an abnormal condition in response to the monitored voltage.

DETAILED DESCRIPTION OF THE INVENTION

A prior-art integrated circuit device will be explained below for a better understanding of this invention.

Figure 1:
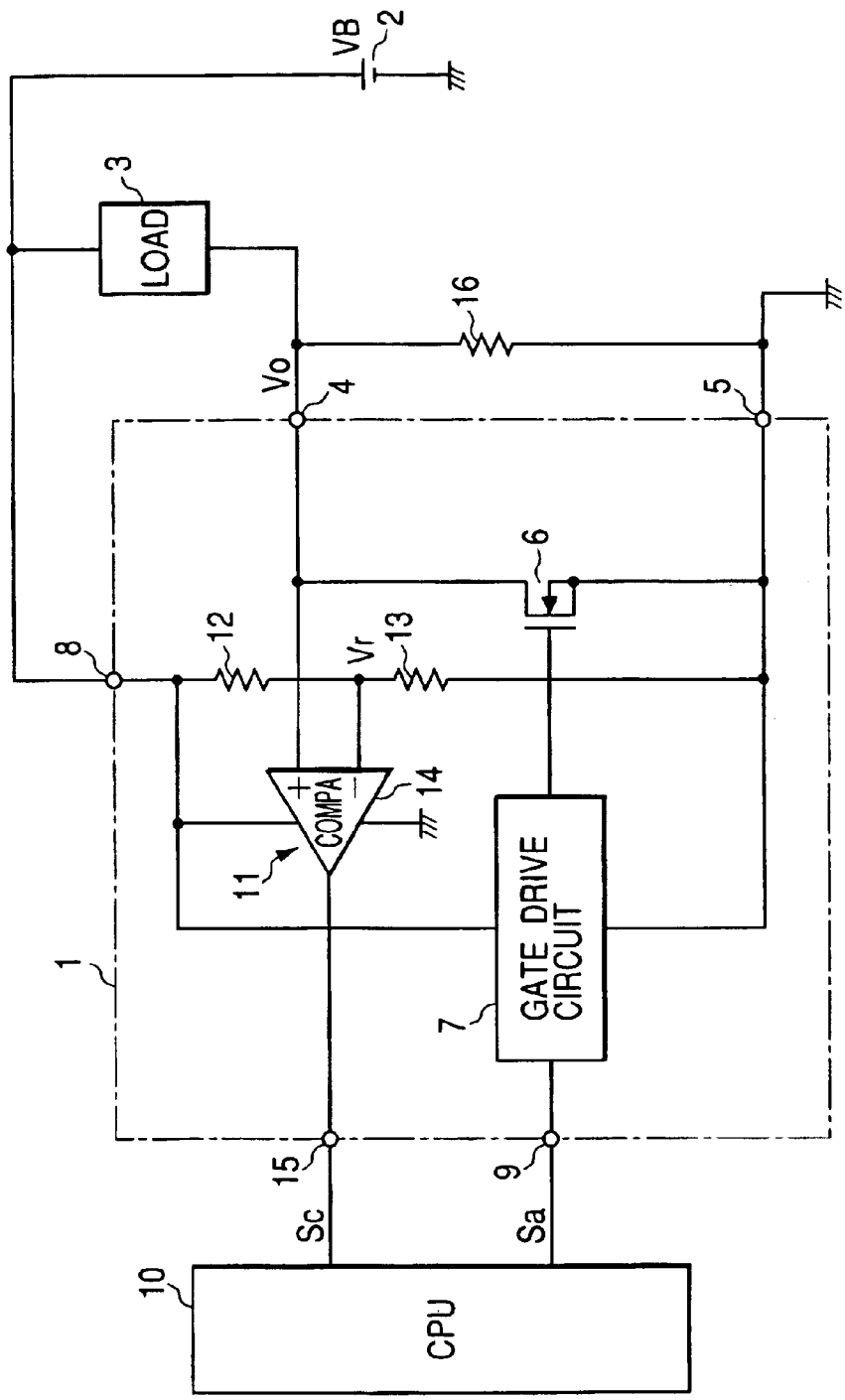
FIG. 1 is a diagram of a prior-art integrated circuit device.

FIG. 1 shows a prior-art integrated circuit device which includes an integrated circuit (IC) 1 used in an on-vehicle control apparatus. The IC 1 includes a load drive circuit for selectively blocking and unblocking a current flowing through a load 3 from an external power supply 2. The external power supply 2 uses a battery. The load 3 is formed by, for example, a solenoid.

The IC 1 is provided with an output terminal 4, a negative power supply terminal (a ground terminal) 5, a positive power supply terminal 8, and an input terminal 9. The IC 1 includes a MOS transistor 6 connected between the output terminal 4 and the negative power supply terminal 5. The MOS transistor 6 acts as a switching element.

The IC 1 further includes a gate drive circuit 7 powered by a voltage VB of the external power supply 2 which is applied between the positive power supply terminal 8 and the negative power supply terminal 5. The gate drive circuit 7 turns on and off the MOS transistor 6 in response to a command signal Sa fed from a CPU 10 via the input terminal 9.

The IC 1 also includes an abnormality detection circuit 11 which has resistors 12 and 13 and a comparator 14. The resistors 12 and 13 are combined in series to form a voltage divider. The series combination of the resistors 12 and 13 is connected between the positive power supply terminal 8 and the negative power supply terminal 5. The series combination of the resistors 12 and 13 divides the power supply voltage VB, thereby generating a division-resultant reference voltage Vr. The device 14 compares the voltage (the output voltage) Vo at the output terminal 4 with the reference voltage Vr. The comparator 14 generates and outputs a comparison-result signal Sc which is transmitted to the CPU 10 via a terminal 15 of the IC 1.

The IC 1 is mounted on a circuit board (a substrate). An external resistor 16 provided on the circuit board and located outside the IC 1 is connected between the output terminal 4 and the negative power supply terminal 5 of the IC 1.

In the case where the load 3 and the MOS transistor 6 are normal, when the MOS transistor 6 changes to its on state, the output voltage Vo drops to an approximately zero level so that the comparison-result signal Sc takes a low level. On the other hand, when the MOS transistor 6 changes to its off state, the output voltage Vo becomes approximately equal to the power supply voltage VB so that the comparison-result signal Sc takes a high level.

In the event that the two ends of the load 3 short-circuit to each other, the output voltage Vo remains equal to the power supply voltage VB regardless of whether the MOS transistor 6 is in its on state or its off state. Thus, the comparison-result signal Sc continues to be in its high-level state.

In the event that a wire of the load 3 breaks, the output voltage Vo remains equal to 0 V regardless of whether the MOS transistor 6 is in its on state or its off state. Thus, the comparison-result signal Sc continues to be in its low-level state. In this case, the resistor 16 fixes the output voltage Vo to 0 V (the voltage at the negative power supply terminal 5) when the MOS transistor 6 is in its off state.

The CPU 10 detects an abnormality (for example, a short circuit or the breaking of a wire) of the load 3 on the basis of the command signal Sa and the comparison-result signal Sc. Similarly, the CPU 10 detects an abnormality of the MOS transistor 6.

In fact, there are many loads including the load 3. Accordingly, many resistors for the respective loads which include the resistor 16 are provided on the circuit board. Therefore, the prior-art integrated circuit device of FIG. 1 is relatively high in cost. The circuit board in the prior-art integrated circuit device of FIG. 1 has a relatively large area.

First Embodiment

Figure 2:
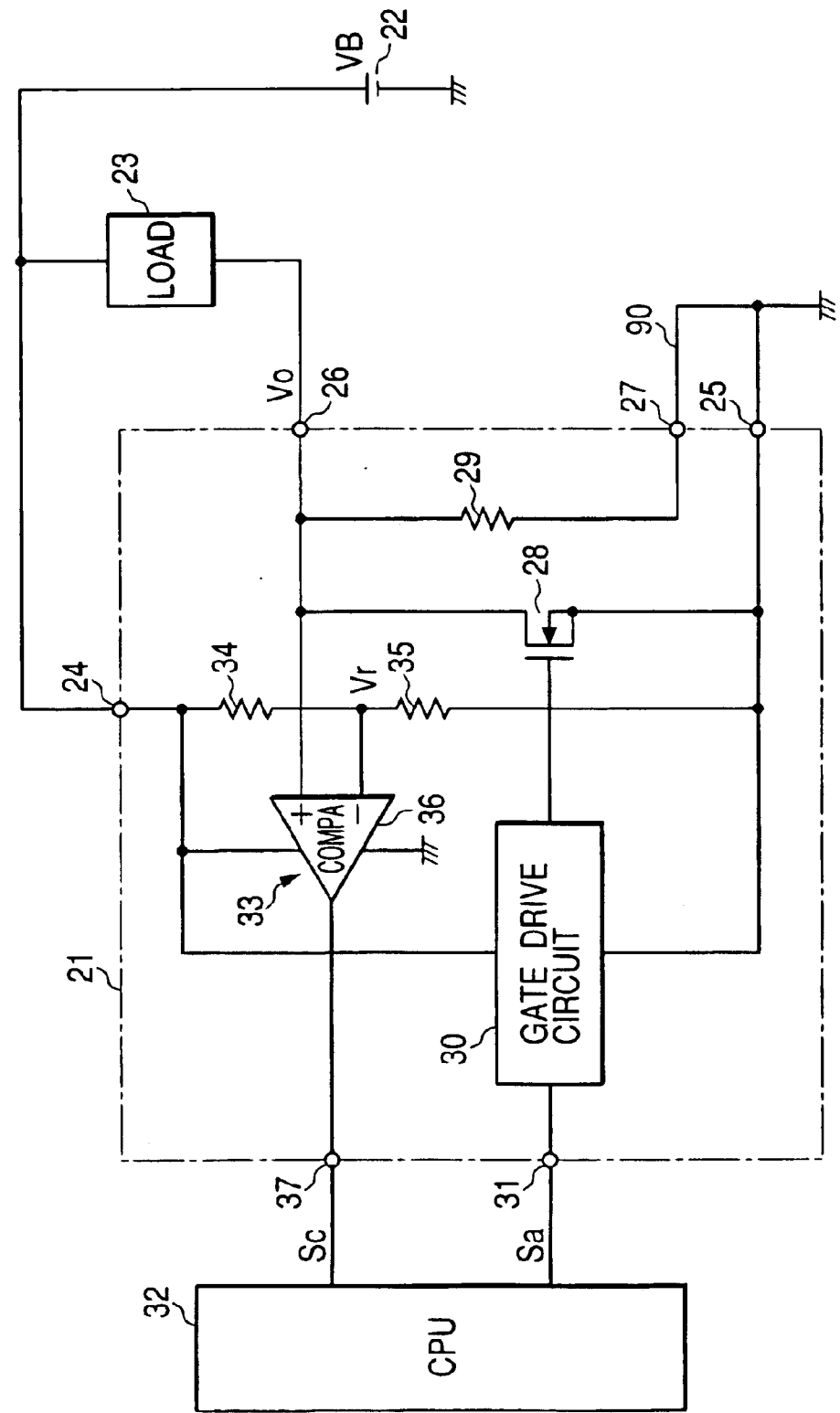
FIG. 2 is a diagram of an integrated circuit device according to a first embodiment of this invention.

FIG. 2 shows an integrated circuit device according to a first embodiment of this invention. The integrated circuit device of FIG. 2 includes an integrated circuit (IC) 21 used in an on-vehicle control apparatus. The IC 21 includes a load drive circuit for selectively blocking and unblocking a current flowing through a load 23 from a battery 22. The battery 22 corresponds to an external power supply. The load 23 is formed by, for example, a coil in a solenoid valve, a relay coil, a lamp, or a light emitting diode.

There are a plurality of loads including the load 23. The IC 21 includes a plurality of load drive circuits in channels for the loads respectively. Only one load drive circuit is shown in FIG. 2.

The IC 21 is soldered to and mounted on a circuit board (a substrate) provided in the on-vehicle control apparatus. The IC 21 is provided with a positive power supply terminal 24, a negative power supply terminal (a ground terminal) 25, an output terminal 26, a negative power supply terminal (a ground terminal) 27, and an input terminal 31. The negative power supply terminals 25 and 27 are separate from and independent of each other. The negative power supply terminal 25 corresponds to a first power supply terminal. The negative power supply terminal 27 corresponds to a second power supply terminal. The positive terminal of the battery 22 is connected to the positive power supply terminal 24. The negative terminal of the battery 22 is connected to the negative power supply terminal 25 (and the negative power supply terminal 27) via a ground. Therefore, the voltage VB of the battery 22 is applied between the positive power supply terminal 24 and the negative power supply terminal 25. The battery voltage VB is also referred to as the power supply voltage VB. The load 23 is connected between the output terminal 26 and the positive terminal of the battery 22. The negative power supply terminal 27 is connected to the negative power supply terminal 25 by a wiring pattern 90 formed on the circuit board and located outside the IC 21.

The IC 21 contains an N-channel MOS transistor 28 which acts as a low side switch. The MOS transistor 28 corresponds to a switching element. The drain of the MOS transistor 28 is connected to the output terminal 26. The source of the MOS transistor 28 is connected to the negative power supply terminal 25. The IC 21 further contains a pull-down resistor 29 connected between the output terminal 26 and the negative power supply terminal 27. The resistor 29 prevents the voltage at the output terminal 26 from being indefinite or unsettled in the event that a wire of the load 23 breaks. The resistor 29 corresponds to an impedance circuit. The resistance of the resistor 29 is considerably greater than the impedance of the load 23. Thus, the power loss caused by the resistor 29 is small. The battery 22, the load 23, and the drain-source path of the MOS transistor 28 are connected to form a closed-loop load-current flow path.

The IC 21 also contains a gate drive circuit 30 connected among the positive power supply terminal 24, the negative power supply terminal 25, the input terminal 31, and the gate of the MOS transistor 28. The gate drive circuit 30 corresponds to a drive control circuit. The gate drive circuit 30 is powered by the voltage VB of the battery 22 which is fed via the positive power supply terminal 24 and the negative power supply terminal 25. The gate drive circuit 30 turns on and off the MOS transistor 28 in response to a command signal Sa fed from a CPU 32 via the input terminal 31. Preferably, the CPU 32 is mounted on the circuit board on which the IC 21 is provided. Alternatively, the CPU 32 may be mounted on a circuit board separate from the circuit board on which the IC 21 is provided.

The gate drive circuit 30 is of a known structure. The gate drive circuit 30 includes, for example, an amplifier having a transistor or a suitable combination of transistors.

The IC 21 further contains an abnormality detection circuit 33 which has resistors 34 and 35 and a comparator 36. The resistors 34 and 35 are combined in series to form a voltage divider. The series combination of the resistors 34 and 35 is connected between the positive power supply terminal 24 and the negative power supply terminal 25. The series combination of the resistors 34 and 35 divides the battery voltage (the power supply voltage) VB, thereby generating a division-resultant reference voltage Vr. An inverting input terminal of the comparator 36 is connected to the junction between the resistors 34 and 35 at which the reference voltage Vr appears. A non-inverting input terminal of the comparator 36 is connected to the output terminal 26. The device 36 compares the voltage (the output voltage) Vo at the output terminal 26 with the reference voltage Vr. The comparator 36 is connected between the positive power supply terminal 24 and a ground (or the negative power supply terminal 25). The comparator 36 is powered by the battery voltage VB. The comparator 36 generates and outputs a signal Sc representing a result of the comparison between the output voltage Vo and the reference voltage Vr. The comparison-result signal Sc is transmitted from the comparator 36 to the CPU 32 via a terminal 37 of the IC 21.

When the integrated circuit device of FIG. 2 is in a state for actual use, the battery 22 and the load 23 are connected with the on-vehicle control apparatus containing the circuit board on which the IC 21 is mounted. In addition, the IC 21 drives the load 23 in response to the command signal Sa fed from the CPU 32. A description will be given of operation of the integrated circuit device of FIG. 2 in the actual use state which occurs in conditions (1)–(5) as follows.

(1) In the Case where the Load 23 is Normal:

When receiving a turn-on command signal Sa from the CPU 32, the gate drive circuit 30 outputs a voltage to the gate of the MOS transistor 28 which is higher than the threshold voltage Vth thereof. As a result, the MOS transistor 28 changes to its on state so that a current caused by the battery 22 flows through the load 23 while the output voltage Vo becomes approximately 0 V. At this time, the output voltage Vo drops below the reference voltage Vr, and hence the comparison-result signal Sc outputted from the comparator 36 takes a low level.

When receiving a turn-off command signal Sa from the CPU 32, the gate drive circuit 30 outputs a voltage of 0 V to the gate of the MOS transistor 28. As a result, the MOS transistor 28 changes to its off state so that the current flowing through the load 23 is blocked while the output voltage Vo becomes approximately equal to the battery voltage VB. At this time, the output voltage Vo rises above the reference voltage Vr, and hence the comparison-result signal Sc outputted from the comparator 36 takes a high level.

(2) In the Event that the Two Ends of the Load 23 Short-Circuit to Each Other:

The output voltage Vo remains approximately equal to the battery voltage VB regardless of whether the MOS transistor 28 is in its on state or its off state. Thus, the comparison-result signal Sc continues to be in its high-level state. The CPU 32 is programmed to implement the following steps. When the received comparison-result signal Sc is in its high-level state although the turn-on command signal Sa is outputted to the gate drive circuit 30, the CPU 32 determines that an abnormality (a fault) occurs. In addition, the CPU 32 immediately outputs a turn-off command signal Sa to the gate drive circuit 30 to change the MOS transistor 28 to its off state. Furthermore, the CPU 32 takes suitable protective measures.

(3) In the Event that a Wire of the Load 23 Breaks:

The output voltage Vo remains equal to 0 V regardless of whether the MOS transistor 28 is in its on state or its off state. Thus, the comparison-result signal Sc continues to be in its low-level state. In this case, the resistor 29 fixes the output voltage Vo to 0 V (the voltage at the negative power supply terminal 25) when the MOS transistor 28 is in its off state. The CPU 32 is programmed to implement the following steps. When the received comparison-result signal Sc is in its low-level state although the turn-off command signal Sa is outputted to the gate drive circuit 30, the CPU 32 determines that an abnormality (a fault) occurs. In addition, the CPU 32 takes suitable protective measures.

(4) In the Event that the Drain and Source of the MOS Transistor 28 Short-Circuit to Each Other:

The output voltage Vo continues to be equal to 0 V. Thus, the comparison-result signal Sc continues to be in its low-level state. When the received comparison-result signal Sc is in its low-level state although the turn-off command signal Sa is outputted to the gate drive circuit 30, the CPU 32 determines that an abnormality (a fault) occurs. In addition, the CPU 32 takes suitable protective measures.

(5) In the Event that the Drain-source Path of the MOS Transistor 28 Breaks:

The output voltage Vo continues to be approximately equal to the battery voltage VB. Thus, the comparison-result signal Sc continues to be in its high-level state. When the received comparison-result signal Sc is in its high-level state although the turn-on command signal Sa is outputted to the gate drive circuit 30, the CPU 32 determines that an abnormality (a fault) occurs. In addition, the CPU 32 immediately outputs a turn-off command signal Sa to the gate drive circuit 30 to change the MOS transistor 28 to its off state. Furthermore, the CPU 32 takes suitable protective measures.

During the manufacture of the IC 21, a leak-current test is implemented with respect to the MOS transistor 28. In general, IC manufacturing steps include a wafer processing step, and a wafer testing step following the wafer processing step. After the wafer testing step, there are assembling steps such as a dicing step, a bonding step, and a sealing step. Then, a package testing step is executed. During the wafer testing step or the package testing step, a leak current flowing through the drain-source path of the MOS transistor 28 is measured while a prescribed test voltage is applied to the MOS transistor 28.

The package testing step is implemented before the IC 21 is mounted on the circuit board. Thus, during the package testing step, the negative power supply terminals 25 and 27 of the IC 21 remain electrically separated or disconnected from each other. In the package testing step, a prescribed test voltage is applied between the output terminal 26 and the negative power supply terminal 25, and a current flowing through the IC 21 via the terminals 25 and 26 is measured. The measured current is equal to a leak current flowing through the drain-source path of the MOS transistor 28.

Three independent pads may be provided on a chip of the IC 21. The pads are respectively connected to the terminals 25, 26, and 27 by wire bonding. In the wafer testing step, a prescribed test voltage is applied between the pads connected to the terminals 26 and 25, and a current flowing through the IC 21 via the pads is measured. The measured current is equal to a leak current flowing through the drain-source path of the MOS transistor 28.

As previously mentioned, the negative power supply terminal 25 and 27 are connected to each other by the wiring pattern 90 on the circuit board when the IC 21 is actually used. Since the pull-down resistor 29 is connected between the output terminal 26 and the negative power supply terminal 27, the voltage at the output terminal 26 is fixed to a constant level of 0 V in the event that the wire of the load 23 breaks. Therefore, the abnormality detection circuit 33 can surely detect an abnormal condition such as a short circuit or the breaking of a wire on the basis of the output voltage Vo.

Since the pull-down resistor 29 is contained in the IC 21, it is unnecessary to provide a pull-down resistor external with respect to the IC 21. Such an external pull-down resistor is relatively expensive, and hence the integrated circuit device of FIG. 2 is relatively low in cost. The circuit board in the integrated circuit device of FIG. 2 is smaller by an area which would be occupied by an external pull-down resistor. Accordingly, the integrated circuit device of FIG. 2 is relatively small in size.

As previously mentioned, the source of the MOS transistor 28 is connected to the negative power supply terminal 25 while the resistor 29 is connected to the negative power supply terminal 27. In original conditions, the negative power supply terminals 25 and 27 are separate from and independent of each other. When the IC 21 is mounted on the circuit board, electric connection between the terminals 25 and 27 is established by the wiring pattern 90 on the circuit board. The step of testing the package of the IC 21 or the step of testing the wafer is executed before the IC 21 is mounted on the circuit board. Thus, during the package testing step or the wafer testing step, the terminals 25 and 27 remain electrically disconnected from each other. As previously mentioned, during the package testing step (or the wafer testing step), a leak current flowing through the MOS transistor 28 is measured while the prescribed test voltage is applied between the output terminal 26 and the negative power supply terminal 25. Since the terminals 25 and 27 remain electrically disconnected from each other, the pull-down resistor 29 is prevented from adversely affecting the measurement of the leak current. Accordingly, the measured leak current is accurate.

Second Embodiment

Figure 3:
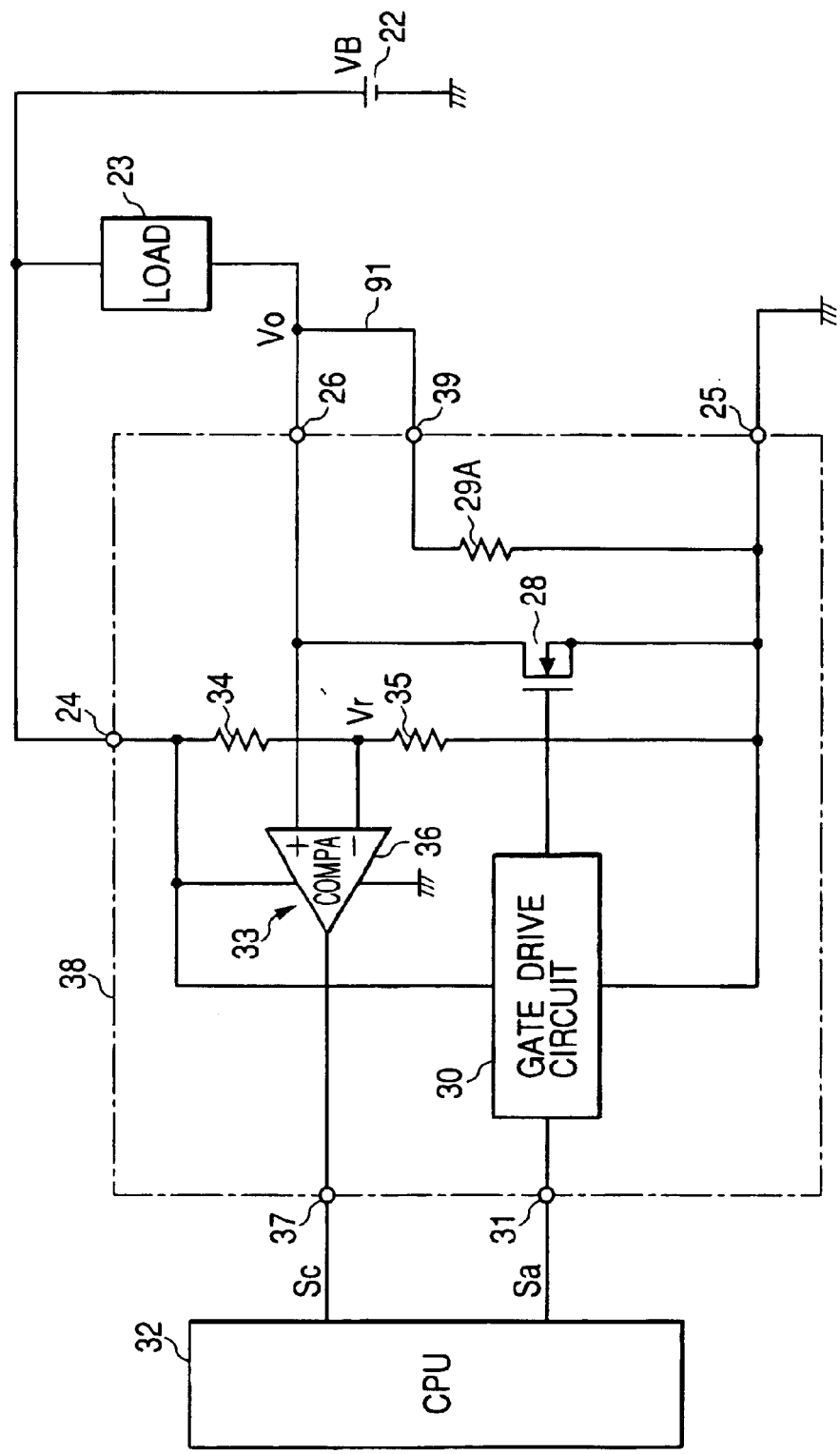
FIG. 3 is a diagram of an integrated circuit device according to a second embodiment of this invention.

FIG. 3 shows an integrated circuit device according to a second embodiment of this invention. The integrated circuit device of FIG. 3 is similar to that of FIG. 2 except for design changes mentioned hereafter. The integrated circuit device of FIG. 3 includes an IC 38 instead of the IC 21 (see FIG. 2).

The IC 38 is provided with two output terminals 26 and 39 which are separate from and independent of each other. The output terminals 26 and 39 correspond to first and second output terminals, respectively. When the IC 38 is mounted on a circuit board, the output terminals 26 and 39 are electrically connected to each other by a wiring pattern 91 formed on the circuit board and located outside the IC 38. The IC 38 contains a pull-down resistor 29A instead of the pull-down resistor 29 (see FIG. 2). In other points, the IC 38 is similar to the IC 21 (see FIG. 2).

In the IC 38, the drain of the MOS transistor 28 is connected to the output terminal 26 while the source thereof is connected to the negative power supply terminal 25. The pull-down resistor 29A is connected between the output terminal 39 and the negative power supply terminal 25.

The integrated circuit device of FIG. 3 provides advantages similar to those of the integrated circuit device of FIG. 2. The step of testing the package of the IC 38 or the step of testing the wafer is executed before the IC 38 is mounted on the circuit board. Thus, during the package testing step or the wafer testing step, the output terminals 26 and 39 remain electrically disconnected from each other. During the package testing step (or the wafer testing step), a leak current flowing through the MOS transistor 28 is measured while the prescribed test voltage is applied between the output terminal 26 and the negative power supply terminal 25. Since the output terminals 26 and 39 remain electrically disconnected from each other, the pull-down resistor 29A is prevented from adversely affecting the measurement of the leak current. Accordingly, the measured leak current is accurate.

Third Embodiment

Figure 4:
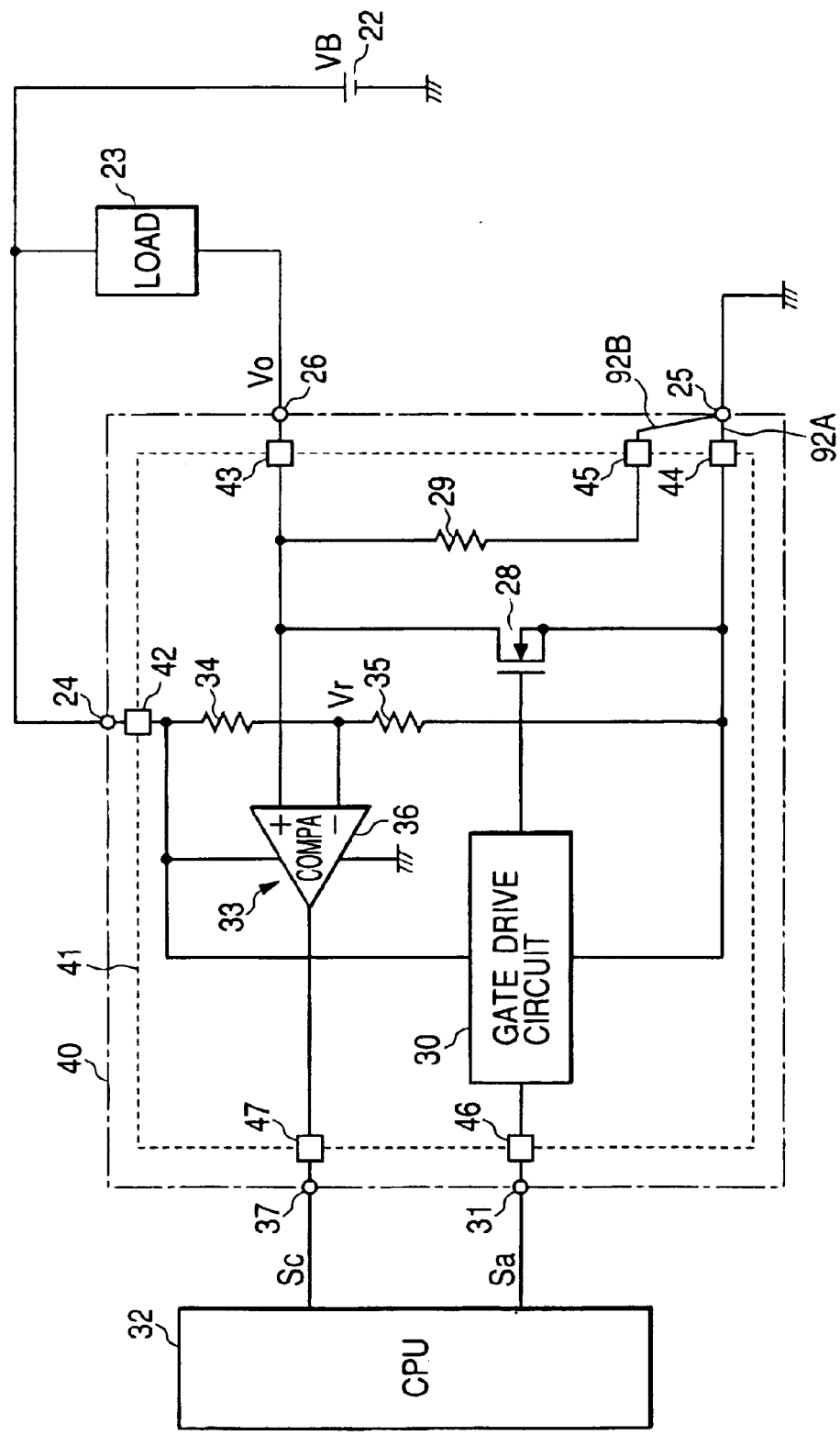
FIG. 4 is a diagram of an integrated circuit device according to a third embodiment of this invention.

FIG. 4 shows an integrated circuit device according to a third embodiment of this invention. The integrated circuit device of FIG. 4 is similar to that of FIG. 2 except for design changes mentioned hereafter. The integrated circuit device of FIG. 4 includes an IC 40 instead of the IC 21 (see FIG. 2). The negative power supply terminal 27 (see FIG. 2) is omitted from the IC 40. A chip 41 is hermetically contained in a package of the IC 40. The chip 41 is formed with the MOS transistor 28, the resistor 29, the gate drive circuit 30, the comparator 36, and the resistors 34 and 35. In other points, the IC 40 is similar to the IC 21 (see FIG. 2).

Pads 42, 43, 44, 45, 46, and 47 separate from and independent of each other are formed on the chip 41. The pad 42 is connected to the gate drive circuit 30, the comparator 36, and one end of the resistor 34. The pad 43 is connected to the drain of the MOS transistor 28, one end of the resistor 29, and the non-inverting input terminal of the comparator 36. The pad 44 is connected to the source of the MOS transistor 28, the gate drive circuit 30, and one end of the resistor 35. The pad 45 is connected to the other end of the resistor 29. The pad 46 is connected to the input terminal of the gate drive circuit 30. The pad 47 is connected to the output terminal of the comparator 36.

Steps of manufacturing the IC 40 include a wire bonding step by which the pads 42, 43, 46, and 47 are electrically connected to the terminals 24, 26, 31, and 37, respectively. In addition, by the wire bonding step, the pads 44 and 45 are electrically connected in common to the negative power supply terminal 25. In FIG. 4, wires electrically connecting the pads 44 and 45 to the negative power supply terminal 25 are denoted by the reference characters "92A" and "92B", respectively.

The pad 43 corresponds to an output-purpose pad. The pads 44 and 45 correspond to first and second power-supply-purpose pads, respectively.

When the integrated circuit device of FIG. 4 is in a state for actual use, the battery 22 and the load 23 are connected with the on-vehicle control apparatus containing the circuit board on which the IC 40 is mounted. The integrated circuit device of FIG. 4 provides advantages similar to those of the integrated circuit device of FIG. 2. During the wafer testing step which is executed before the steps of assembling the IC 40, a leak current flowing through the MOS transistor 28 is measured while the prescribed test voltage is applied between the pads 43 and 44. Since the pads 44 and 45 remain electrically disconnected from each other, the pull-down resistor 29 is prevented from adversely affecting the measurement of the leak current. Accordingly, the measured leak current is accurate.

The number of the terminals on the IC 40 is smaller than that of the terminals on the IC 21 or IC 38 (see FIGS. 2 and 3) by one per channel. The smaller number of the terminals causes a reduction of the manufacture cost and an increase in the degree of freedom of IC designing.

Fourth Embodiment

Figure 5:
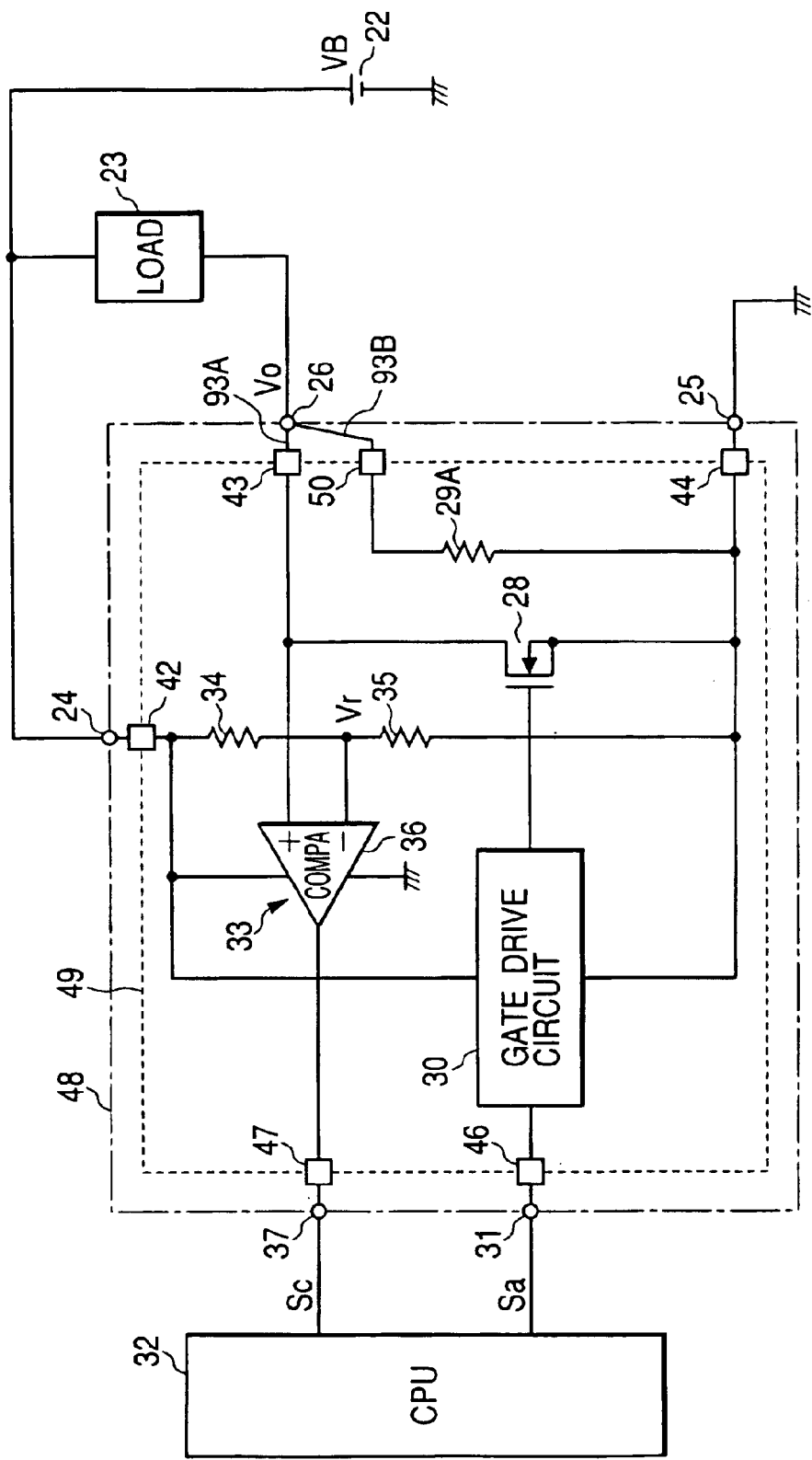
FIG. 5 is a diagram of an integrated circuit device according to a fourth embodiment of this invention.

FIG. 5 shows an integrated circuit device according to a fourth embodiment of this invention. The integrated circuit device of FIG. 5 is similar to that of FIG. 4 except for design changes mentioned hereafter. The integrated circuit device of FIG. 5 includes an IC 48 instead of the IC 40 (see FIG. 4). The negative power supply terminal 27 (see FIG. 2) is omitted from the IC 48. A chip 49 is hermetically contained in a package of the IC 48. The chip 49 is similar to the chip 41 (see FIG. 4) except for the following points. The chip 49 is formed with a pull-down resistor 29A instead of the pull-down resistor 29 (see FIG. 4). The pad 45 (see FIG. 4) is omitted from the chip 49. The chip 49 is provided with a pad 50. The pull-down resistor 29A is connected between the pads 44 and 50.

Steps of manufacturing the IC 48 include a wire bonding step by which the pads 43 and 50 are electrically connected in common to the output terminal 26. In FIG. 5, wires electrically connecting the pads 43 and 50 to the output terminal 26 are denoted by the reference characters "93A" and "93B", respectively. The pads 43 and 50 correspond to first and second output-purpose pads, respectively.

When the integrated circuit device of FIG. 5 is in a state for actual use, the battery 22 and the load 23 are connected with the on-vehicle control apparatus containing the circuit board on which the IC 48 is mounted. The integrated circuit device of FIG. 5 provides advantages similar to those of the integrated circuit device of FIG. 4. During the wafer testing step which is executed before the steps of assembling the IC 48, a leak current flowing through the MOS transistor 28 is measured while the prescribed test voltage is applied between the pads 43 and 44. Since the pads 43 and 50 remain electrically disconnected from each other, the pull-down resistor 29A is prevented from adversely affecting the measurement of the leak current. Accordingly, the measured leak current is accurate.

Fifth Embodiment

Figure 6:
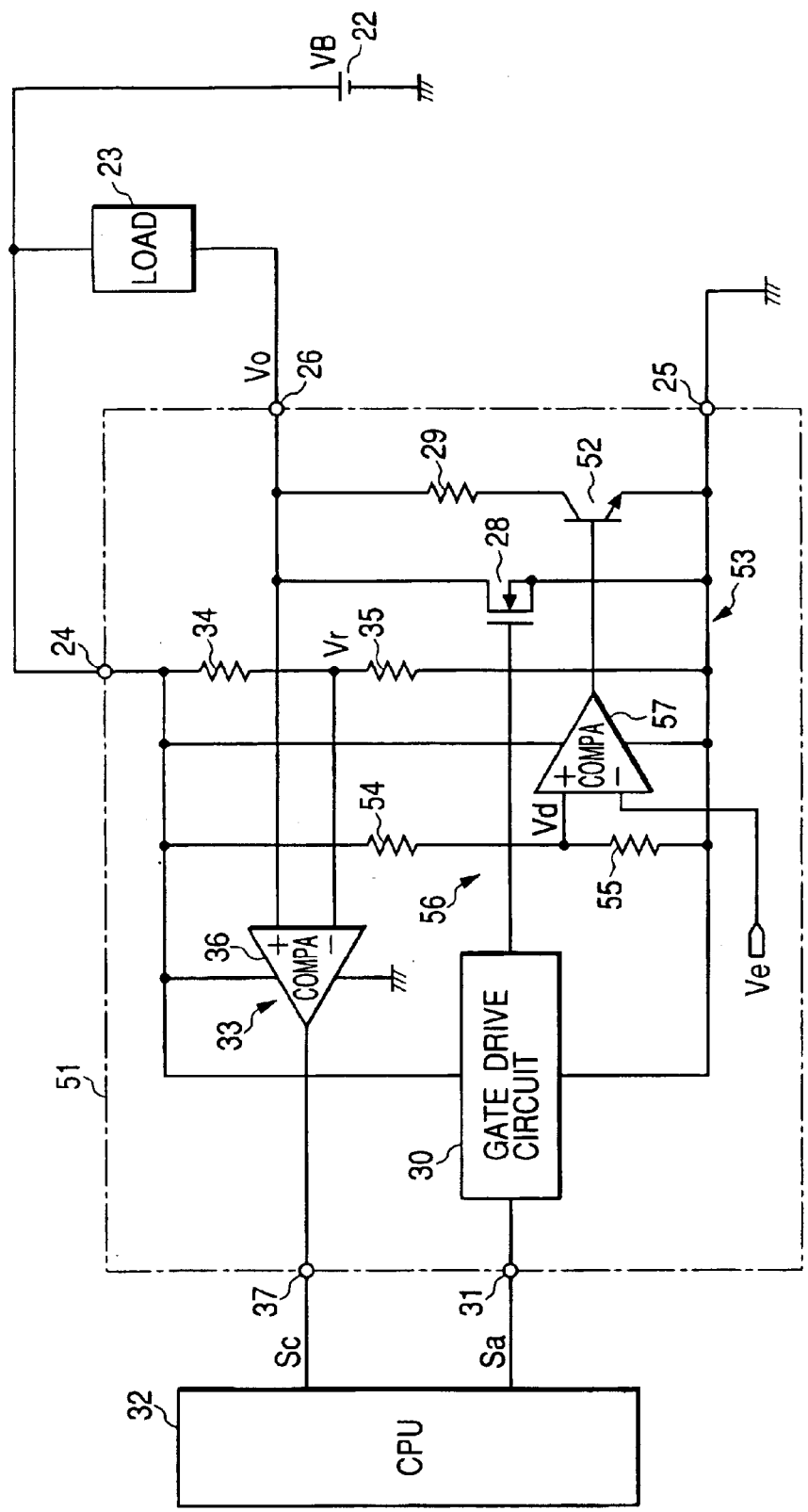
FIG. 6 is a diagram of an integrated circuit device according to a fifth embodiment of this invention.

FIG. 6 shows an integrated circuit device according to a fifth embodiment of this invention. The integrated circuit device of FIG. 6 is similar to that of FIG. 2 except for design changes mentioned hereafter. The integrated circuit device of FIG. 6 includes an IC 51 instead of the IC 21 (see FIG. 2). The IC 51 is basically similar to the IC 21 (see FIG. 2) except that an additional arrangement is provided therein and the negative power supply terminal 27 (see FIG. 2) is omitted therefrom.

As shown in FIG. 6, the IC 51 contains an NPN transistor 52 corresponding to a switch circuit. The collector of the transistor 52 is connected via the pull-down resistor 29 to the output terminal 26. The emitter of the transistor 52 is connected to the negative power supply terminal 25.

The IC 51 further contains a switch control circuit 53 for driving and controlling the transistor 52. The switch control circuit 53 has resistors 54 and 55 and a comparator 57. The resistors 54 and 55 are combined in series to form a voltage divider 56. The voltage divider 56 is connected between the positive power supply terminal 24 and the negative power supply terminal 25. The device 56 divides the battery voltage VB, thereby generating a division-resultant voltage Vd. A non-inverting input terminal of the comparator 57 is connected to the junction between the resistors 54 and 55 at which the division-resultant voltage Vd appears. An inverting input terminal of the comparator 57 is subjected to a prescribed reference voltage Ve. The output terminal of the comparator 57 is connected to the base of the transistor 52. The device 57 compares the division-resultant voltage Vd with the reference voltage Ve. The comparator 57 is connected between the positive power supply terminal 24 and the negative power supply terminal 25. The comparator 57 is powered by the battery voltage VB fed via the positive power supply terminal 24 and the negative power supply terminal 25. The comparator 57 generates a signal representing a result of the comparison between the division-resultant voltage Vd and the reference voltage Ve. The comparator 57 outputs the comparison-result signal to the base of the transistor 52. The comparator 57 corresponds to a comparison circuit and a drive circuit.

When the integrated circuit device of FIG. 6 is in a state for actual use, the battery voltage VB is applied between the positive power supply terminal 24 and the negative power supply terminal 25. The gate drive circuit 30 is activated by the battery voltage VB. Normally, the battery voltage VB causes the division-resultant voltage Vd to be higher than the reference voltage Ve. Thus, in this case, the comparator 57 outputs a high-level signal to the base of the transistor 52 so that the transistor 52 is in its on state. As a result, there occurs a condition substantially equivalent to the direct connection of the pull-down resistor 29 between the output terminal 26 and the negative power supply terminal 25. Accordingly, the integrated circuit device of FIG. 6 provides advantages similar to those of the integrated circuit device of FIG. 2.

When the battery voltage VB drops and therefore the division-resultant voltage Vd decreases below the reference voltage Ve, the comparator 57 outputs a 0-V signal (a low-level signal) to the base of the transistor 52 so that the transistor 52 falls into its off state. As a result, the pull-down resistor 29 is disconnected from the negative power supply terminal 25. The drop in the battery voltage VB causes the gate drive circuit 30 to be deactivated. Thus, the MOS transistor 28 falls into its off state.

The size of the transistor 52 is remarkably smaller than that of the MOS transistor 28. Therefore, a leak current flowing through the transistor 52 is negligible with respect to that flowing through the MOS transistor 28. During the package testing step or the wafer testing step, the transistor 52 is in its off state so that the pull-down resistor 29 is disconnected from the negative output terminal 25. During the package testing step (or the wafer testing step), a leak current flowing through the MOS transistor 28 is measured while the prescribed test voltage is applied between the output terminal 26 and the negative power supply terminal 25. The pull-down resistor 29 and the transistor 52 are prevented from adversely affecting the measurement of the leak current. Accordingly, the measured leak current is accurate.

Both the gate drive circuit 30 and the switch control circuit 53 are powered by the battery voltage VB. Thus, it is possible to implement cooperation such that the transistor 52 is in its on state only when the gate drive circuit 30 is activated. The integrated circuit device of FIG. 6 provides a reduction of the manufacture cost and an increase in the degree of freedom of IC designing.

It should be noted that a drive circuit (driving means) including an amplifier may be provided between the output terminal of the comparator 57 and the base of the transistor 52.

Sixth Embodiment

Figure 7:
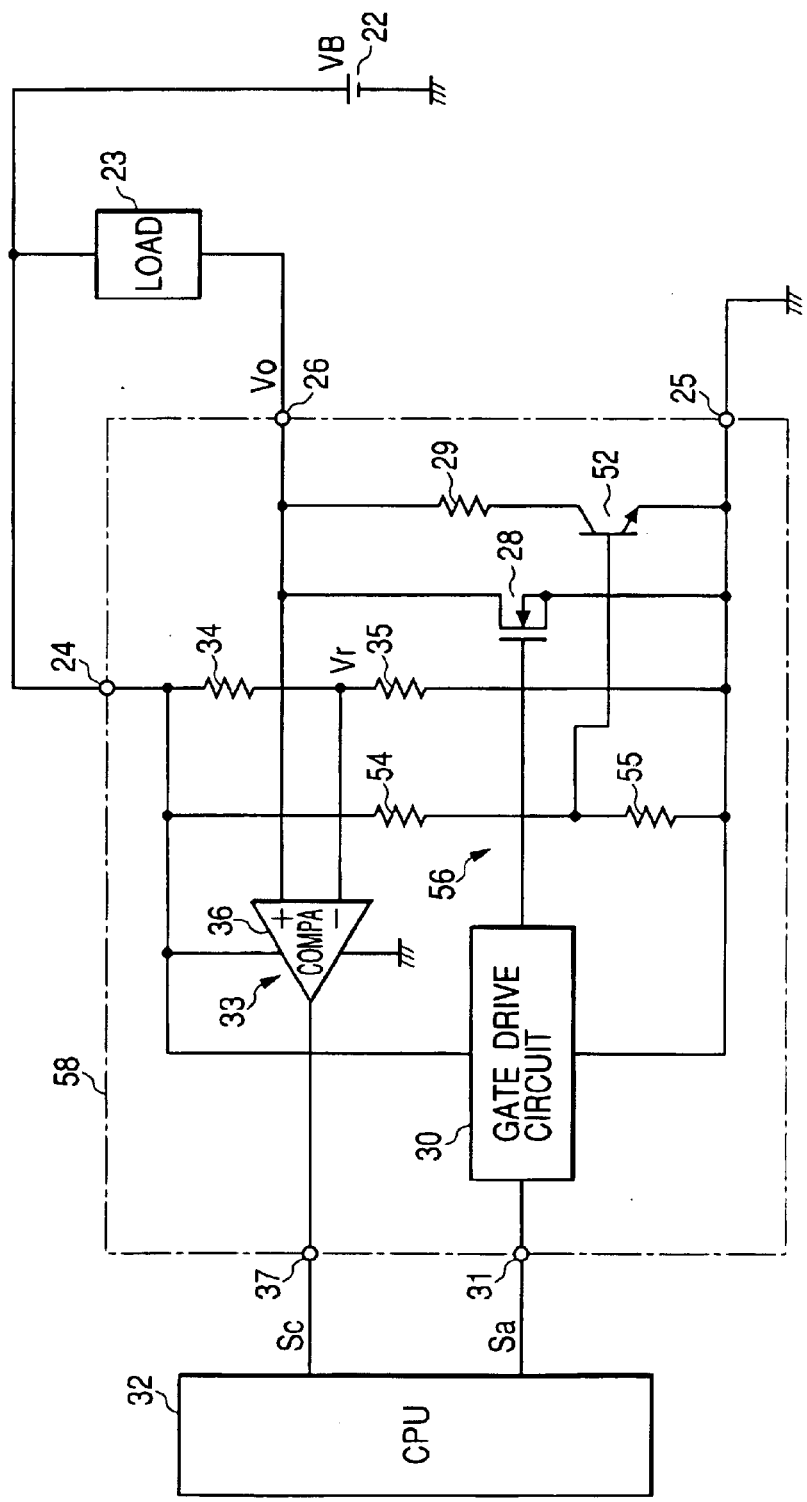
FIG. 7 is a diagram of an integrated circuit device according to a sixth embodiment of this invention.

FIG. 7 shows an integrated circuit device according to a sixth embodiment of this invention. The integrated circuit device of FIG. 7 is similar to that of FIG. 6 except for a design change mentioned hereafter. The integrated circuit device of FIG. 7 includes an IC 58 instead of the IC 51 (see FIG. 6). The IC 58 is similar to the IC 51 (see FIG. 6) except that the comparator 57 (see FIG. 6) is omitted therefrom.

As shown in FIG. 7, the base of the transistor 52 is directly connected to the junction between the resistors 54 and 55. The ratio in resistance between the resistors 54 and 55 (that is, the voltage division ratio) is chosen so that the transistor 52 is in its on state as long as the gate drive circuit 30 is activated by the battery voltage VB.

The integrated circuit device of FIG. 7 provides advantages similar to those of the integrated circuit device of FIG. 6. The absence of the comparator 57 (see FIG. 6) is effective in reducing the IC size and cost.

Seventh Embodiment

Figure 8:
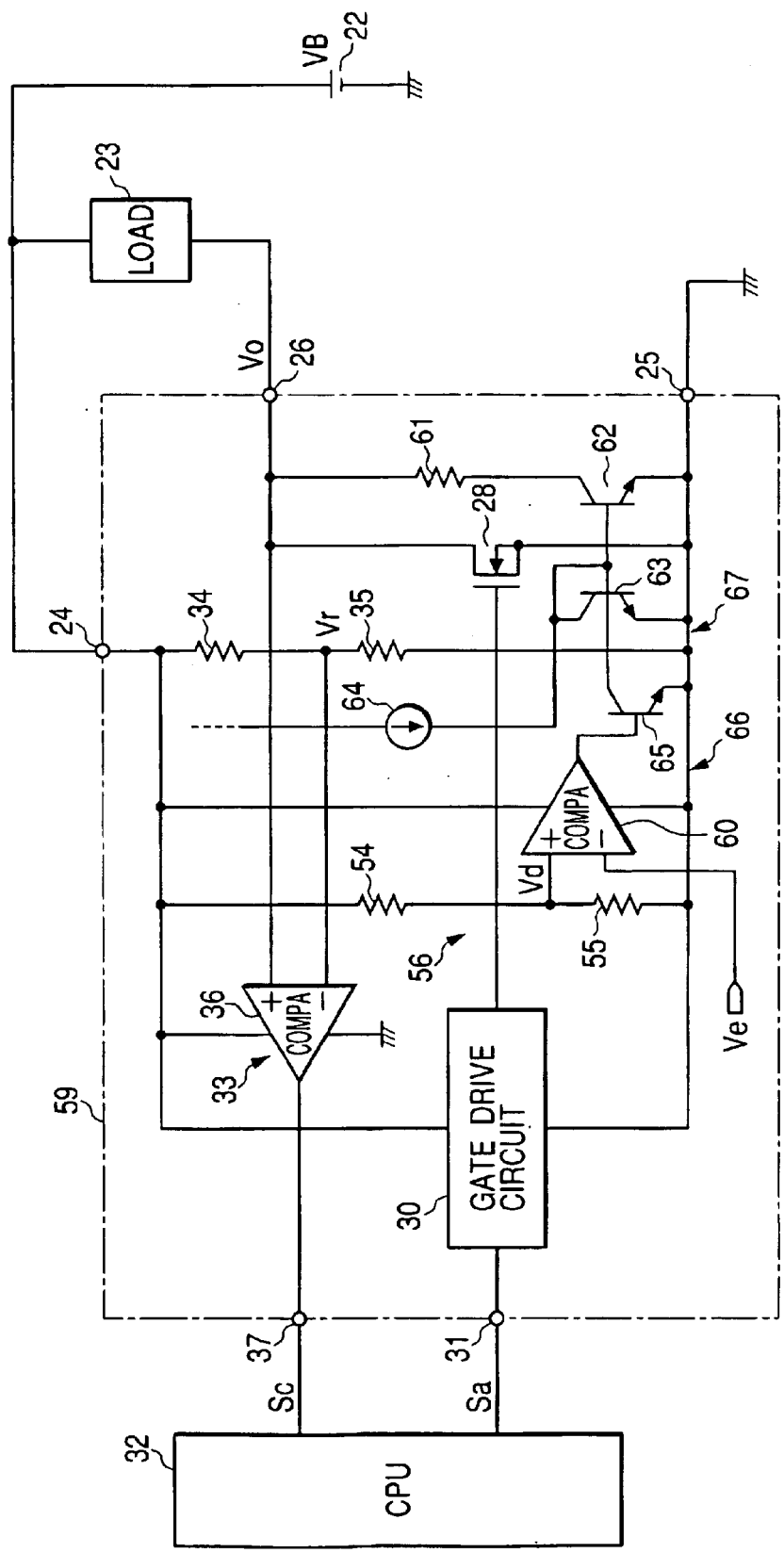
FIG. 8 is a diagram of an integrated circuit device according to a seventh embodiment of this invention.

FIG. 8 shows an integrated circuit device according to a seventh embodiment of this invention. The integrated circuit device of FIG. 8 is similar to that of FIG. 6 except for design changes mentioned hereafter. The integrated circuit device of FIG. 8 includes an IC 59 instead of the IC 51 (see FIG. 6). The IC 59 is basically similar to the IC 51 (see FIG. 6) except for the following points.

As shown in FIG. 8, the IC 59 contains a comparator 60 connected between the positive power supply terminal 24 and the negative power supply terminal 25. The comparator 60 is powered by the battery voltage VB fed via the positive power supply terminal 24 and the negative power supply terminal 25. An inverting input terminal of the comparator 60 is connected to the junction between the resistors 54 and 55. The inverting input terminal of the comparator 60 is subjected to the division-resultant voltage Vd. On the other hand, a non-inverting input terminal of the comparator 60 is subjected to the reference voltage Ve.

The IC 59 further contains a resistor 61, NPN transistors 62 and 63, a constant-current generation circuit 64, and an NPN transistor 65. The collector of the transistor 62 is connected via the resistor 61 to the output terminal 26. The emitter of the transistor 62 is connected to the negative power supply terminal 25. The base of the transistor 62 and the base of the transistor 63 are connected to each other to form a common control terminal. The emitter of the transistor 63 is connected to the negative power supply terminal 25. The collector 63 of the transistor 63 is connected to the bases of the transistors 62 and 63. Also, the collector of the transistor 63 is connected to the constant-current generation circuit 64. The transistors 62 and 63 compose a current mirror circuit. The constant-current generation circuit 64 is powered by a power supply voltage separate from the battery voltage VB. The constant-current generation circuit 64 supplies a constant current to the transistor 63. The collector of the transistor 65 is connected to the bases of the transistors 62 and 63. The emitter of the transistor 65 is connected to the negative power supply terminal 25. The base of the transistor 65 is connected to the output terminal of the comparator 60.

The voltage divider 56, the comparator 60, and the transistor 65 compose a current control circuit 66. The current control circuit 66, the constant-current generation circuit 64, and the current mirror circuit (the transistors 62 and 63) compose a constant-current circuit 67.

When the integrated circuit device of FIG. 8 is in a state for actual use, the battery voltage VB is applied between the positive power supply terminal 24 and the negative power supply terminal 25. The gate drive circuit 30 is activated by the battery voltage VB. Normally, the battery voltage VB causes the division-resultant voltage Vd to be higher than the reference voltage Ve. Thus, in this case, the comparator 57 outputs a 0-V signal (a low-level signal) to the base of the transistor 65 so that the transistor 65 is in its off state. In the current mirror circuit, a constant current determined by the constant current fed to the transistor 63 from the constant-current generation circuit 64 flows through the collector-emitter path of the transistor 62. In the event that the wire of the load 23 breaks under this condition, the collector voltage of the transistor 62 decreases and the output voltage Vo drops to approximately 0 V. Accordingly, the abnormality detection circuit 33 can surely detect an abnormal condition such as a short circuit or the breaking of a wire on the basis of the output voltage Vo.

When the battery voltage VB drops and therefore the division-resultant voltage Vd decreases below the reference voltage Ve, the comparator 60 outputs a high-level signal to the base of the transistor 65 so that the transistor 65 changes to its on state. As a result, the voltage at the bases of the transistors 62 and 63 drops to 0 V, and the transistor 63 falls into its off state. The drop in the battery voltage VB causes the gate drive circuit 30 to be deactivated. Thus, the MOS transistor 28 falls into its off state.

The size of the transistor 62 is remarkably smaller than that of the MOS transistor 28. Therefore, a leak current flowing through the transistor 62 is negligible with respect to that flowing through the MOS transistor 28. During the package testing step or the wafer testing step, the transistor 62 is in its off state. During the package testing step (or the wafer testing step), a leak current flowing through the MOS transistor 28 is measured while the prescribed test voltage is applied between the output terminal 26 and the negative power supply terminal 25. The constant-current circuit 67 is prevented from adversely affecting the measurement of the leak current. Accordingly, the measured leak current is accurate.

The value of the current flowing through the transistor 62 in the current mirror circuit can be decided in consideration of the type of the load 23. In the case where the load 23 includes a light emitting diode, the value of the current flowing through the transistor 62 is chosen so that the load 23 is prevented from emitting sensible light when being required to be turned off. The resistor 61 protects the transistor 62 from static electricity introduced via the output terminal 26. The resistor 61 may be omitted from the IC 59.

Eighth Embodiment

Figure 9:
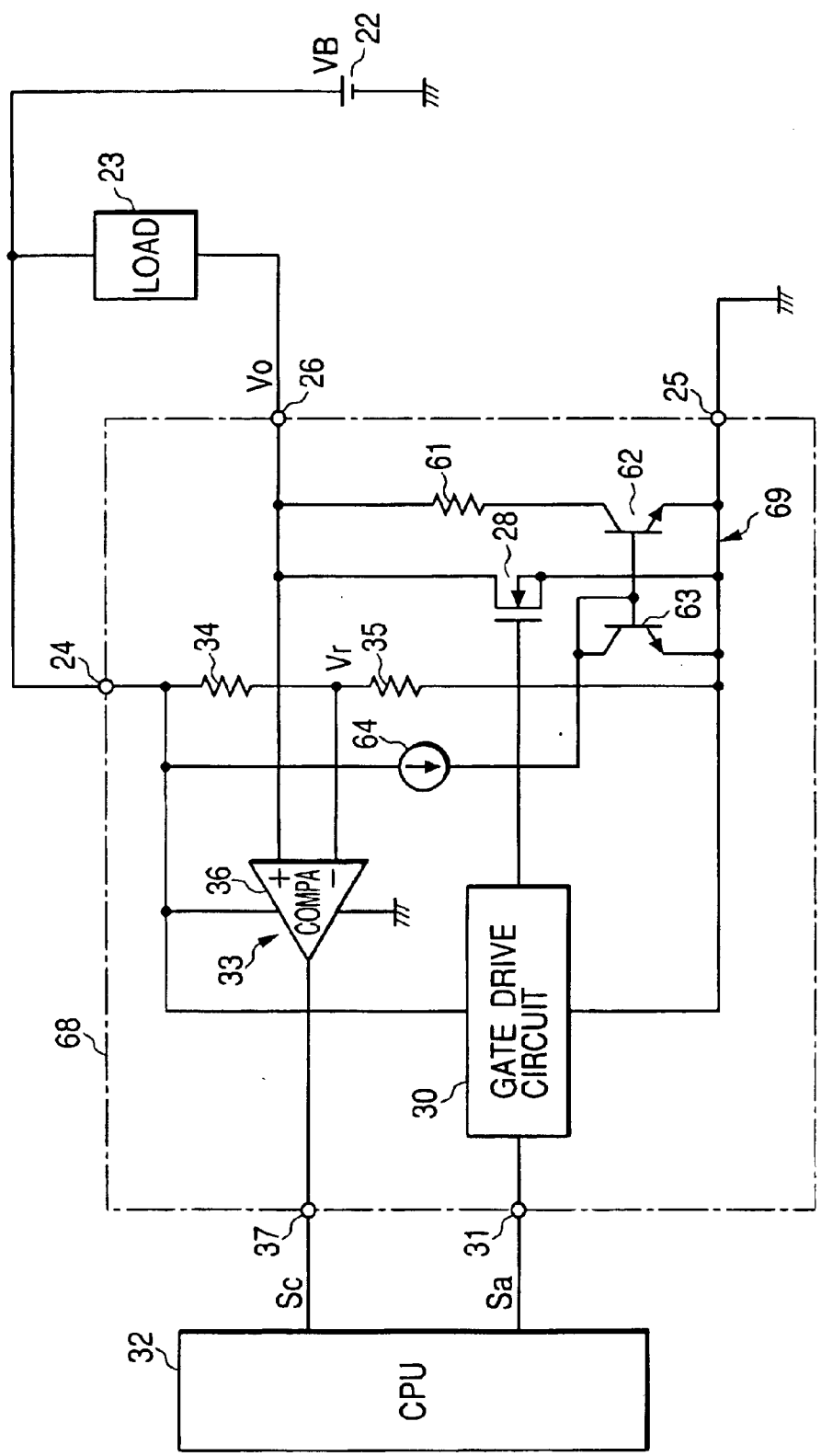
FIG. 9 is a diagram of an integrated circuit device according to an eighth embodiment of this invention.

FIG. 9 shows an integrated circuit device according to an eighth embodiment of this invention. The integrated circuit device of FIG. 9 is similar to that of FIG. 8 except for design changes mentioned hereafter. The integrated circuit device of FIG. 9 includes an IC 68 instead of the IC 59 (see FIG. 8). The IC 68 is similar to the IC 59 (see FIG. 8) except that the current control circuit 66 (see FIG. 8) is omitted therefrom and the constant-current generation circuit 64 is connected between the output terminal 26 and the current mirror circuit (the transistors 62 and 63). The constant-current generation circuit 64 is powered by the battery voltage VB. The constant-current generation circuit 64 and the current mirror circuit (the transistors 62 and 63) compose a constant-current circuit 69.

An output stage of the constant-current generation circuit 64 includes a current mirror circuit. In the case where the battery voltage VB is higher than the base-emitter voltage VBE+ of the transistor 63 and the collector-emitter voltage VCE of the current mirror circuit in the constant-current generation circuit 64, the constant current circuit 69 operates in a constant-current mode. On the other hand, in the case where the battery voltage VB is not higher than the voltages VBE+ and VCE, the constant-current mode of operation of the constant current circuit 69 is suspended.

The integrated circuit device of FIG. 9 provides advantages similar to those of the integrated circuit device of FIG. 8. The absence of the current control circuit 66 (see FIG. 8) is effective in reducing the IC size and cost.

Ninth Embodiment

A ninth embodiment of this invention is a modification of one of the first to eighth embodiments thereof. The ninth embodiment of this invention uses a bipolar transistor instead of the MOS transistor 28.

Tenth Embodiment

A tenth embodiment of this invention is a modification of one of the first to eighth embodiments thereof. The tenth embodiment of this invention uses a P-channel MOS transistor instead of the N-channel MOS transistor 28. The P-channel MOS transistor is designed to act as a high side switch.

Eleventh Embodiment

An eleventh embodiment of this invention is a modification of the fifth or sixth embodiment thereof. The eleventh embodiment of this invention uses an N-channel MOS transistor instead of the transistor 52 (see FIGS. 6 and 7).

Twelfth Embodiment

A twelfth embodiment of this invention is a modification of the seventh or eighth embodiment thereof. The twelfth embodiment of this invention uses N-channel MOS transistors instead of the transistors 62 and 63 (see FIGS. 8 and 9).

What is claimed is:

1. An integrated circuit device comprising:

an output terminal for connection with a terminal of an external load;

first and second power supply terminals for connection with the same terminal of an external power supply;

a switching element connected between the output terminal and the first power supply terminal, wherein the switching element, the external load, and the external power supply form a load current flow path;

an impedance circuit connected between the output terminal and the second power supply terminal;

an abnormality detection circuit for monitoring a voltage at the output terminal, and detecting an abnormal condition on the basis of the monitored voltage; and a drive control circuit for driving and controlling the switching element.

2. An integrated circuit device comprising:

first and second output terminals for connection with a terminal of an external load;

a power supply terminal for connection with a terminal of an external power supply;

a switching element connected between the first output terminal and the power supply terminal, wherein the switching element, the external load, and the external power supply form a load current flow path;

an impedance circuit connected between the second output terminal and the power supply terminal;

an abnormality detection circuit for monitoring a voltage at the first and second output terminals, and detecting an abnormal condition on the basis of the monitored voltage; and a drive control circuit for driving and controlling the switching element.

3. An integrated circuit device comprising:

a package having an output terminal for connection with a terminal of an external load, and a power supply terminal for connection with one terminal of an external power supply; and a chip hermetically provided in the package and having an output-purpose pad and first and second power-supply-purpose pads, the output-purpose pad being connected to the output terminal of the package, the first and second power-supply-purpose pads being connected to the power supply terminal of the package;

wherein the chip comprises:

(1) a switching element connected between the output-purpose pad and the first power-supply-purpose pad, wherein the switching element, the external load, and the external power supply form a load current flow path;

(2) an impedance circuit connected between the output-purpose pad and the second power-supply-purpose pad;

(3) an abnormality detection circuit for monitoring a voltage at the output-purpose pad, and detecting an abnormal condition on the basis of the monitored voltage; and (4) a drive control circuit for driving and controlling the switching element.

4. An integrated circuit device comprising:

a package having an output terminal for connection with a terminal of an external load, and a power supply terminal for connection with a terminal of an external power supply; and a chip hermetically provided in the package and having first and second output-purpose pads and a power-supply-purpose pad, the first and second output-purpose pads being connected to the output terminal of the package, the power-supply-purpose pad being connected to the power supply terminal of the package;

wherein the chip comprises:

(1) a switching element connected between the first output-purpose pad and the power-supply-purpose pad, wherein the switching element, the external load, and the external power supply form a load current flow path;

(2) an impedance circuit connected between the second output-purpose pad and the power-supply-purpose pad;

(3) an abnormality detection circuit for monitoring a voltage at the first and second output-purpose pads, and detecting an abnormal condition on the basis of the monitored voltage; and (4) a drive control circuit for driving and controlling the switching element.

5. An integrated circuit device comprising:

an output terminal for connection with a terminal of an external load;

a power supply terminal for connection with a terminal of an external power supply;

a switching element connected between the output terminal and the power supply terminal, wherein the switching element, the external load, and the external power supply form a load current flow path;

an impedance circuit and a switch circuit connected in series between the output terminal and the power supply terminal;

an abnormality detection circuit for monitoring a voltage at the output terminal, and detecting an abnormal condition on the basis of the monitored voltage;

a drive control circuit for driving and controlling the switching element; and a switch control circuit for setting the switch circuit in a closed state under a condition that the drive control circuit is fed with an operation-purpose power supply voltage.

6. An integrated circuit device as recited in claim 5, wherein the switch control circuit comprises means for setting the switch circuit in the closed state when the operation-purpose power supply voltage is equal to or higher than a reference voltage.

7. An integrated circuit device as recited in claim 6, wherein the switch circuit comprises a transistor, and the switch control circuit comprises (1) a voltage divider for dividing the operation-purpose power supply voltage to get a division-resultant voltage, (2) a comparison circuit for comparing the division-resultant voltage and the reference voltage with each other, and (3) a drive circuit for driving the transistor in response to a comparison-result signal outputted from the comparison circuit.

8. An integrated circuit device as recited in claim 5, wherein the switch circuit comprises a transistor, and the switch control circuit comprises (1) means for dividing the operation-purpose power supply voltage to get a division-resultant voltage, and means for applying the division-resultant voltage to a control terminal of the transistor.

9. An integrated circuit device as recited in claim 1, wherein the impedance circuit comprises a resistor.

10. An integrated circuit device comprising:

an output terminal for connection with a terminal of an external load;

a power supply terminal for connection with a terminal of an external power supply;

a switching element connected between the output terminal and the power supply terminal, wherein the switching element, the external load, and the external power supply form a load current flow path;

an abnormality detection circuit for monitoring a voltage at the output terminal, and detecting an abnormal condition on the basis of the monitored voltage;

a drive control circuit for driving and controlling the switching element; and a constant-current circuit connected between the output terminal and the power supply terminal for generating a constant current under a condition that the drive control circuit is fed with an operation-purpose power supply voltage.

11. An integrated circuit device as recited in claim 10, wherein the constant-current circuit comprises:

a current mirror circuit; and a constant-current generation circuit connected to an input end of the current mirror circuit for outputting a constant current when being fed with the operation-purpose power supply voltage.

12. An integrated circuit device as recited in claim 10, wherein the constant-current circuit comprises:

a current mirror circuit;

a constant-current generation circuit for feeding a constant current to an input end of the current mirror circuit; and a current control circuit for applying a current output suspension signal to a common control terminal of the current mirror circuit when the operation-purpose power supply voltage is equal to or lower than a reference voltage.

13. An integrated circuit device as recited in claim 10, further comprising a protective resistor connected between the output terminal and the constant-current circuit.

14. An integrated circuit device comprising:

a circuit board having a wiring pattern;

an integrated circuit having an output terminal for connection with a terminal of an external load, and first and second power supply terminals for connection with a terminal of an external power supply, the first and second power supply terminals being separated and disconnected from each other when the integrated circuit is separated from the circuit board, the first and second power supply terminals being connected to each other by the wiring pattern of the circuit board when the integrated circuit is mounted on the circuit board;

a switching transistor contained in the integrated circuit and being connected between the output terminal and the first power supply terminal, wherein the switching transistor, the external load, and the external power supply form a load current flow path; and a pull-down resistor contained in the integrated circuit and being connected between the output terminal and the second power supply terminal.

15. An integrated circuit device as recited in claim 14, wherein the integrated circuit comprises an abnormality detection circuit for monitoring a voltage at the output terminal, and detecting an abnormal condition in response to the monitored voltage.

16. An integrated circuit device comprising:

a circuit board having a wiring pattern;

an integrated circuit having first and second output terminals for connection with a terminal of an external load, and a power supply terminal for connection with a terminal of an external power supply, the first and second output terminals being separated and disconnected from each other when the integrated circuit is separated from the circuit board, the first and second output terminals being connected to each other by the wiring pattern of the circuit board when the integrated circuit is mounted on the circuit board:

a switching transistor contained in the integrated circuit and being connected between the first output terminal and the power supply terminal, wherein the switching transistor, the external load, and the external power supply form a load current flow path; and a pull-down resistor contained in the integrated circuit and being connected between the second output terminal and the power supply terminal.

17. An integrated circuit device as recited in claim 16, wherein the integrated circuit comprises an abnormality detection circuit for monitoring a voltage at the first and second output terminals, and detecting an abnormal condition in response to the monitored voltage.

18. An integrated circuit device as recited in claim 2, wherein the impedance circuit comprises a resistor.

19. An integrated circuit device as recited in claim 3, wherein the impedance circuit comprises a resistor.

20. An integrated circuit device as recited in claim 4, wherein the impedance circuit comprises a resistor.

21. An integrated circuit device as recited in claim 5, wherein the impedance circuit comprises a resistor.

* * * * *

UNITED STATES PATENT AND TRADEMARK OFFICE
CERTIFICATE OF CORRECTION

PATENT NO.    : 6,785,106 B2
DATED         : August 31, 2004
INVENTOR(S)   : Junichi Nagata It is certified that error appears in the above-identified patent and that said Letters Patent is hereby corrected as shown below:

<u>Title page, Item [54] and Column 1, line 1,</u>
Title, "INTEGRATE" should read -- INTEGRATED --

Signed and Sealed this

Twenty-ninth Day of March, 2005

JON W. DUDAS
*Director of the United States Patent and Trademark Office*